(12) United States Patent
Wang et al.

(10) Patent No.: US 11,796,588 B2
(45) Date of Patent: Oct. 24, 2023

(54) DIRECT CURRENT MEASUREMENT OF 1/F TRANSISTOR NOISE

(71) Applicant: TEXAS INSTRUMENTS INCORPORATED, Dallas, TX (US)

(72) Inventors: Yuguo Wang, Plano, TX (US); Steven Loveless, Sachse, TX (US); Tathagata Chatterjee, Allen, TX (US); Jerry Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 44 days.

(21) Appl. No.: 17/537,007

(22) Filed: Nov. 29, 2021

(65) Prior Publication Data

US 2022/0082608 A1 Mar. 17, 2022

Related U.S. Application Data

(62) Division of application No. 15/859,244, filed on Dec. 29, 2017, now Pat. No. 11,249,130.

(51) Int. Cl.
*G01R 31/26* (2020.01)

(52) U.S. Cl.
CPC ............................ *G01R 31/2626* (2013.01)

(58) Field of Classification Search
CPC .................................................. G01R 31/2626
See application file for complete search history.

(56) References Cited

U.S. PATENT DOCUMENTS

| 4,894,566 | A | * | 1/1990 | Rush | H03G 5/18 327/309 |
|---|---|---|---|---|---|
| 8,452,252 | B2 | * | 5/2013 | Barth | H04B 1/0028 455/286 |
| 8,542,010 | B2 | * | 9/2013 | Cesaretti | G01R 33/0035 324/202 |
| 10,312,921 | B1 | | 6/2019 | Cheng | |
| 2005/0093634 | A1 | | 5/2005 | Smith et al. | |
| 2013/0148957 | A1 | | 6/2013 | Snawerdt | |
| 2016/0013816 | A1 | | 1/2016 | Xia et al. | |
| 2018/0183456 | A1 | | 6/2018 | Lee et al. | |
| 2022/0082608 | A1 | * | 3/2022 | Wang | G01R 31/2626 |

* cited by examiner

*Primary Examiner* — Jermele M Hollington
*Assistant Examiner* — Zannatul Ferdous
(74) *Attorney, Agent, or Firm* — Andrew R. Ralston; Frank D. Cimino

(57) ABSTRACT

A system comprises a noise generator circuit and a noise envelope detector circuit. The noise generator circuit comprises a first amplifier including a single transistor pair that is operable to generate 1/f noise, an output amplifier coupled to the first amplifier and configured to generate a 1/f noise signal as a function of the 1/f noise. The noise envelope detector circuit comprises a low pass filter operable to pass low frequency signals of the 1/f noise signal as a filtered 1/f noise signal, and a second amplifier or a comparator coupled to the low pass filter and operable to output a direct current (DC) voltage signal according to an envelope of the filtered 1/f noise signal, where the DC voltage signal is a function of an envelope of the filtered 1/f noise signal.

16 Claims, 4 Drawing Sheets

DIRECT CURRENT MEASUREMENT OF 1/F TRANSISTOR NOISE

CROSS-REFERENCE TO RELATED APPLICATIONS

This is a divisional application of U.S. patent application Ser. No. 15/859,244, which is incorporated herein by reference in its entirety.

BACKGROUND

None.

SUMMARY

In accordance with at least one embodiment of the invention, a system comprises A system comprises a noise generator circuit and a noise envelope detector circuit. The noise generator circuit comprises a first amplifier including a single transistor pair that is operable to generate 1/f noise, an output amplifier coupled to the first amplifier and configured to generate a 1/f noise signal as a function of the 1/f noise. The noise envelope detector circuit comprises a low pass filter operable to pass low frequency signals of the 1/f noise signal as a filtered 1/f noise signal, and a second amplifier or a comparator coupled to the low pass filter and operable to output a direct current (DC) voltage signal according to an envelope of the filtered 1/f noise signal, where the DC voltage signal is a function of an envelope of the filtered 1/f noise signal.

In accordance with another embodiment of the invention, an apparatus comprises a first amplifier including a single transistor pair that is operable to generate 1/f noise, a low-pass filter operable to pass low frequency signals of the 1/f noise as a filtered 1/f noise, and a second amplifier or a comparator coupled to the low pass filter and operable to output a direct current (DC) signal according to an amplitude of the filtered 1/f noise.

In accordance with another embodiment of the invention, a method comprises applying, at a noise generator circuit, a first bias current value at a first amplifier to generate a bias current of the first amplifier; applying, at the noise generator circuit, a second current value to the first amplifier to reduce a voltage offset of the first amplifier; applying, at the noise generator circuit, the at least one drain current to a transistor pair to generate 1/f noise; filtering, with a noise envelope detector circuit, the 1/f noise to generate filtered 1/f noise; and comparing, at the noise envelope detector circuit, the filtered 1/f noise with a reference voltage to output a direct current (DC) output voltage.

BRIEF DESCRIPTION OF THE DRAWINGS

For a detailed description of various examples, reference will now be made to the accompanying drawings in which.

DETAILED DESCRIPTION

Figure 1:
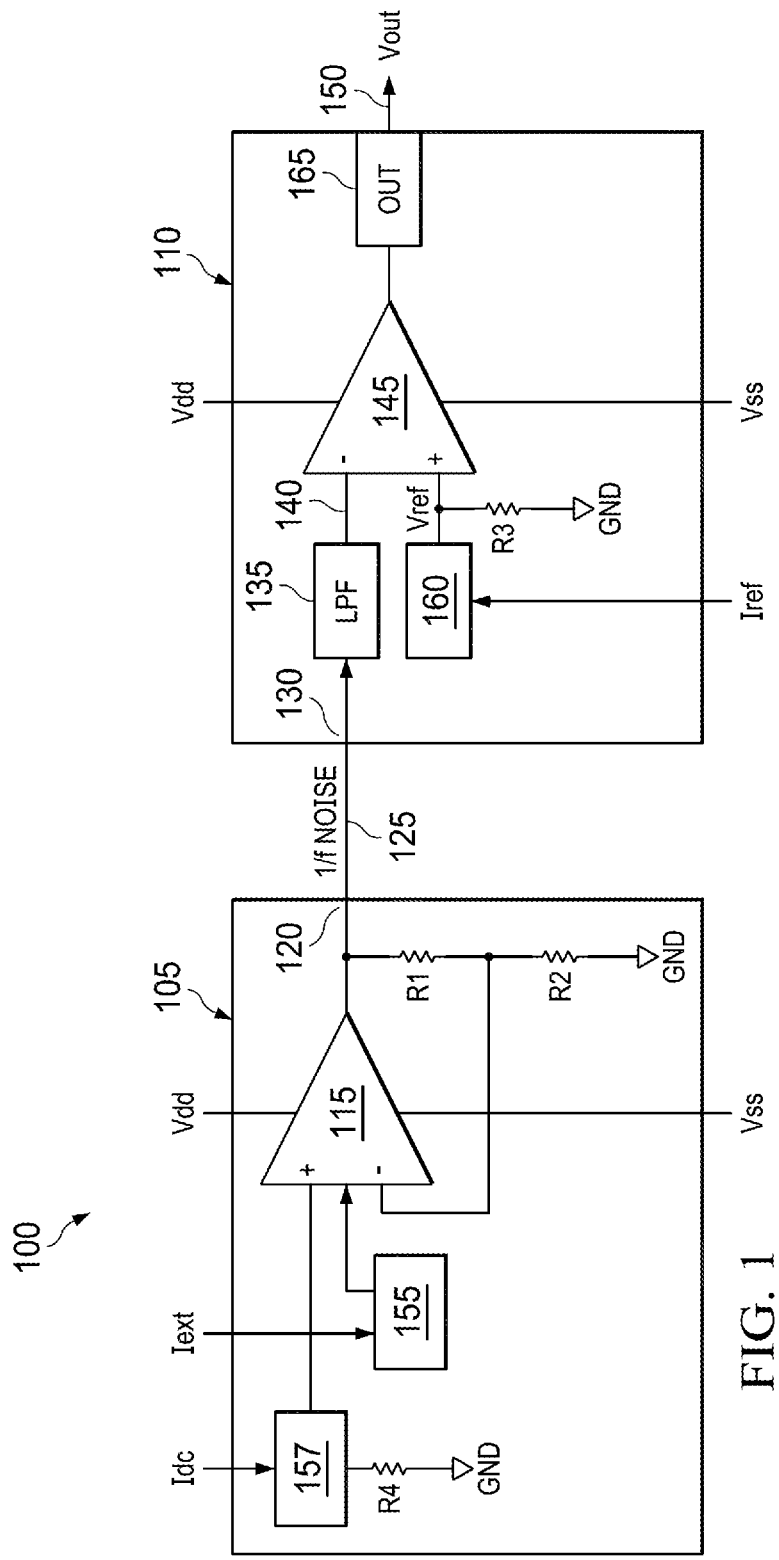
FIG. 1 is a schematic diagram of an illustrative 1/f noise measurement circuit in accordance with various examples.

1/f noise (also referred to as "flicker noise") is a type of noise that is inherent to transistors. 1/f noise limits the performance of transistors and cannot be eliminated but only minimized. 1/f noise exhibits an inverse frequency (1/f) power spectral density ("PSD") curve where a magnitude of the 1/f noise decreases with increasing frequency. 1/f noise is often characterized by the corner frequency fc between the region dominated by the low-frequency 1/f noise and the higher-frequency "flat-band" noise. Therefore, quantifying 1/f noise is useful for determining the noise performance and product definition of transistors. Conventional methods to measure 1/f noise during wafer fabrication require spectrum analyzers to measure a power and a frequency of the 1/f noise. These conventional methods also require special test setups that block out external noise during 1/f noise measurement. Therefore, in general, there is no known inline parametric circuit that can be used to measure this 1/f noise within the wafer fabrication environment.

Disclosed herein are examples of a 1/f noise measurement circuit that enables direct DC measurement of 1/f noise of transistors (also referred to as 1/f transistor noise). The 1/f noise measurement circuit uses an output DC voltage as a proxy for integrated transistor 1/f noise by correlating the output DC voltage to the 1/f noise. An external bias current is applied to an input of a bias block in a 1/f noise measurement circuit in order to generate drain-to-source currents at a plurality of p-type metal oxide semiconductor field effect transistors ("PMOS") transistors at an input of the noise generator circuit. In one example, an input pair of PMOS transistors is diode-connected PMOS transistors. The drain-to-source currents in the PMOS transistors generates a bias condition in a plurality of n-type metal oxide semiconductor field effect transistors ("NMOS") transistors to generated drain-to-source currents in the NMOS transistors. The drain-to-source currents generated through the PMOS transistors are a function of the external bias current due to bias conditions and geometries of the gate terminals of the PMOS and NMOS transistors. Similarly, the NMOS transistors have the same geometries as the PMOS transistors and generate drain-to-source currents that are also a function of the external bias current. These drain-to-source currents are used in a single transistor pair to generate 1/f noise. The single transistor pair receives the drain-to-source currents from the PMOS and NMOS transistors and generates the 1/f noise. The single transistor pair can be selectively coupled to additional NMOS transistors to increase the size of the single transistor pair. The 1/f noise amplitude is a function of bias currents that are applied to the 1/f noise measurement circuit and a channel current density of a NMOS single transistor pair. The 1/f noise amplitude is inputted into a Class NB amplifier block, which outputs a noise signal comprising the 1/f noise. The single transistor pair contributes to over 80% of the 1/f noise generated by the 1/f noise measurement circuit. The low-frequency envelope of the 1/f noise output is compared with a reference voltage signal to output DC voltages based on the comparison. Thus, the output DC voltages from the 1/f noise measurement circuit correspond to the 1/f noise.

In accordance with the disclosed embodiments, a system comprises a noise generator circuit that is electrically coupled to a noise envelope detector circuit. In some examples, the noise generator circuit receives an external bias current to generate drain-to-source currents at a plurality of PMOS and NMOS transistors at an input of the noise generator circuit. The external bias current is used to bias the gate terminals of the PMOS transistors in the noise generator circuit, which generates a bias condition in the NMOS transistors. An input pair of PMOS transistors are diode-connected PMOS transistors that are mirrored to other PMOS transistors. The PMOS transistors bias the NMOS transistors to generate drain currents. The NMOS transistors are also current mirrored. The drain currents from the PMOS and NMOS transistors are inputted to a single NMOS transistor pair that generates 1/f noise. The 1/f noise correlates with an external bias current such that varying the external bias current can vary the power of the 1/f noise that is generated pair.

In some examples, a noise envelope detector circuit is operable to determine a DC voltage as a function of an envelope of the noise signal comprising the 1/f noise. The noise envelope detector comprises a low-pass filter that filters the 1/f noise signal to pass signals lower than a defined cut-off frequency fc of the low-pass filter. In an example, the low-pass filter is implemented as an active resistor R and capacitor C ("active RC") low-pass filter (LPF) that is operable as a "Miller capacitor" to multiply the effective value of the capacitor through a miller effect in order to move the pass-band of the active RC LPF to a lower frequency. The filtered 1/f noise signal is outputted to a comparator that compares the envelope of filtered 1/f noise signal with an external reference DC signal. In an embodiment, an amplifier may be used in lieu of the comparator. The comparator is configured as an envelope detector to compare the magnitude of the envelope of the 1/f noise signal with a reference voltage that is ramped up and down at an input to the comparator. The comparator compares the reference voltage with the envelope of filtered 1/f noise signal and outputs a high DC voltage when the amplitude of the envelope of the filtered 1/f noise signal is lower than the reference voltage and outputs a low DC voltage when the amplitude of the envelope of the filtered 1/f noise signal is higher than the reference voltage.

Referring to the figures, FIG. 1 shows an illustrative 1/f noise measurement circuit 100 for measuring 1/f noise of a transistor in accordance with various embodiments. The 1/f noise measurement circuit 100 includes a noise generator circuit 105 that is electrically coupled to a noise envelope detector circuit 110. In some examples, noise generator circuit 105 is electrically coupled to the noise envelope detector circuit 110 by way of wires, metal traces on a printed circuit board, metal routing on a silicon substrate, or any other suitable form of conductive coupling. 1/f noise measurement circuit 100 is implemented, for example, as a standalone device (for example, implemented on its own substrate, enclosed within its own electrical chip package, etc.) or implemented with other electrical devices in which a 1/f noise signal comprising 1/f noise is to be measured, enclosed in an electrical chip package that includes other devices, etc.

In an example, noise generator circuit 105 comprises an integrated circuit with an operational amplifier ("op amp") 115, resistors R1 and R2, a positive voltage supply rail Vdd and a negative voltage supply rail Vss. in some examples, resistors R1 and R2 are internal to the noise generator circuit 105 or external to the noise generator circuit 105. Vdd receives a positive voltage and Vss receives a negative voltage from external DC sources. Vdd and Vss use these positive and negative voltages to bias the drain and source terminals of one or more transistors in the operational amplifier 115. In some examples, the operational amplifier includes P-channel Field Effect transistors (P-FET), N-channel FETs (N-FET), P-channel metal oxide semiconductor FETs (PMOS), N-channel metal oxide semiconductor FETs (NMOS), or a combination of P-FET, N-FET, PMOS, or NMOS transistors.

In an embodiment, op amp 115 receives an external bias current (illustrated as Iext) and an offset control current (illustrated as Idc). Iext current is inputted to an input of a bias block of the op amp 115 at input pad or node 155. Iext directly biases a plurality of input PMOS transistors in the op amp 115 to generate drain-to-source currents (Ids). Iext biases the gate and drain terminals of a pair of PMOS transistors in a PMOS transistor block 210 (see FIG. 2) inside the op amp 115. Using the Iext current at input pad 155 applies a bias voltage to the gates (for example Vgs) of the input pair of PMOS transistors and thereby controls drain currents (for example Ids) of the PMOS transistors. Only two pairs of PMOS transistors in PMOS transistor block 210 (FIG. 2) is a diode-connected PMOS transistor. The diode-connected PMOS transistors operate in a saturation region according to the bias point of the Vgs and Vds of diode-connected PMOS transistor. The pair of diode-connected PMOS transistors are "current mirrored" to additional PMOS transistors by passing a bias voltage Vgs to the remainder of the PMOS transistors in order to generate drain currents in the rest of the PMOS transistors, as will be shown and described in FIG. 2. Some PMOS transistors are matched and generate drain currents as a linear factor of Iext (see FIG. 2). In an example, the PMOS transistors generates Ids currents that are approximately scaled by a linear factor of the value of the Iext current such as, for example, a linear factor 0.5×, 1×, 2×, 3×, 4×, or the like, where x represents a value of Iext current.

A DC offset current (illustrated as "Idc") is applied to an input pad 157. Idc is an external DC offset current that is applied to the non-inverting terminal to reduce the effect of Vos voltage from mV to nanovolts (nV) at the output 120 while amplifying the 1/f noise signal 125 of the 1/f noise to the mV range through the closed loop gain of the op amp 115. A bias resistor R4 in ohm (Ω) is connected between input pad 157 and ground (GND) and receives the Idc current to apply a DC offset voltage (in volts) to the non-inverting terminal (illustrated as a "+" symbol of the op amp 115). This DC offset voltage compensates for the built-in offset of the op amp 115 so that the output of the op amp 115 is at mid-rail between Vdd and Vss. An offset current Idc is applied to the input of the op amp 115 instead of a voltage source directly to the input of the op amp 115 because most instruments in production have a current source accuracy of Nano Amperes (nA), which is equivalent to 100 nV if Idc is 1 nA and R4=100Ω (Idc×R4) while a voltage source accuracy is in the mV range. The mV range is not precise enough for offset compensation or cancellation. The offset voltage (Vos) of the op amp 115 is normally is in millivolt (mV) range while the 1/f noise generated by the op amp 115 is in microvolt (μV) range. The DC offset voltage applies a voltage compensation to eliminate the effect of the op amp 115 offset so that the 1/f noise can be amplified to the mV range at the output of the op amp 115 while the effect of offset is reduced to nV. In an example, the PMOS transistors are connected to the NMOS transistors (in a corresponding NMOS transistor block) and may be arranged in transistor pairs across six (6) legs of the op amp 115 The PMOS transistors act as current sources to the NMOS transistors and create a bias condition in the NMOS transistors based on the Ids currents in the PMOS transistors. In some examples, each NMOS transistor generates an Ids current based on the bias current (Ids) from the PMOS transistor. The Ids currents generated in the NMOS transistor legs are also scaled by a linear factor of Iext current.

In an embodiment, each leg of the PMOS transistors is coupled to a respective leg of the NMOS transistors. The Ids currents in the PMOS transistors apply a bias voltage Vgs to the NMOS transistors to generate Ids currents in the NMOS transistors, as will be shown and described in FIG. 2. In an example, the combined Ids currents from the PMOS and NMOS transistors are inputted to a single NMOS transistor pair 220 (shown in FIG. 2) to generate a 1/f noise as a function of the current density of the single NMOS transistor pair 220, as will be shown and described below in FIG. 2. In an example, the Ids current in the single NMOS transistor pair is a linear factor of 6× the Iext current. In other examples, the PMOS and NMOS transistors may be scaled so that Ids current at other linear factors may be defined in order to generate 0.5×, 1×, 2×, 3×, 4×, or the like of the Iext current. The Ids currents are used to generate 1/f noise in the single NMOS transistor pair 220 (shown in FIG. 2) that is output as a 1/f noise signal 125 in millivolts (mV). The 1/f noise signal 125 represents an amplified 1/f noise that is amplified using the fixed gain of the op amp 115 through a negative feedback loop of the op amp 115, in order to produce the 1/f noise signal 125 in millivolts (mV). The closed loop gain of the op amp 115 is generally 1+(R1/R2). However, the offset voltage (Vos) of the op amp 115 may also be amplified from mV to μV through the closed loop gain of the op amp 115. To eliminate or minimize Vos voltage, the Idc current, discussed above, is applied to the non-inverting terminal at input node 157 while a feedback signal from output 120 is received at the inverting terminal (illustrated as a "−" symbol of the op amp 115) via Resistors R1 and R2, and output from the comparator 145 as a DC output voltage at Vout 150 at node 165 is monitored. In an example, R1 is 10 Kilo ohm (KΩ) and R2 is 100Ω.

It is to be appreciated that 1/f noise directly correlates to the Iext current that is applied to the input diode-connected PMOS transistors of the PMOS transistor block 210 (FIG. 2) in op amp 115 such that the 1/f noise can be quantified based on the Iext current. In an example, the Iext current has a corresponding magnitude of 1/f noise that is generated in the NMOS transistor pair 220 (FIG. 2) as the 1/f noise of the NMOS transistor pair 220 is a function of bias current and physical properties of the NMOS transistors in the NMOS transistor pair 220, and varying the bias currents based on Iext current also varies the power of the 1/f noise. For example, greater the drain current Ids through the NMOS transistor pair 220, greater is the 1/f noise and by receiving 6 times the Iext current as Ids in the NMOS transistor pair 220, the power of the 1/f noise is correspondingly greater by 6 times as well. It is to be appreciated that the matched transistor pair 220 (FIG. 2) generates greater than approximately 80 percent (%) of the total noise that is generated by the 1/f noise measurement circuit 100, which is outputted at the output 120 of the noise generator circuit 105 as 1/f noise signal 125.

In an example, noise envelope detector circuit 110 comprises an integrated circuit with a Low-Pass Filter 135 (LPF), a comparator 145, positive supply rail Vdd and negative supply rail Vss. The positive supply rail Vdd and the negative supply rail Vss are the same voltage supply rails Vdd and Vss of noise generator circuit 105. Vdd and Vss are configured to bias the drain and source terminals of one or more transistors in the comparator 145. In an embodiment, an amplifier may be used in lieu of the comparator 145. LPF 135 is electrically coupled to the noise generator circuit 105 at input node 130 and is electrically coupled to the comparator 145 at the inverting terminal of comparator 145. LPF 135 receives the 1/f noise signal 125 from the noise generator circuit 105 via input node 130 and filters the 1/f noise signal 125 to filter signals lower than the cutoff frequency of the LPF 135 as a filtered 1/f noise signal 140 to comparator 145. In one example, the LPF is implemented as an active RC LPF that is operable as a "Miller capacitor" to multiply the effective value of the capacitor through a miller effect in order to pass signals lower than the corner frequency of the 1/f noise signal such as, for example, to around 5 Kilohertz (kHz). LPF 135 includes a miller effect with a miller capacitor C coupled between the gate and drain terminals of an input NMOS transistor of the comparator 145. Filtered 1/f noise signal 125 is outputted as filtered noise signal 140 to the comparator 145. Comparator 145 receives the filtered noise signal 140 at an inverting terminal (illustrated as a "+" symbol) of the comparator 145 and an external reference DC current signal (Iref current) is applied to an input pad 160. Bias resistor R3 is connected between input pad 160 and ground (GND) and receives the Iref current and applies a reference voltage Vref (in volts) as a product of Iref current × resistance R3 at the non-inverting terminal (illustrated as a "+" symbol) of the comparator 145. In some examples, Iref has a range of about 1 uA to about 100 uA. Comparator 145 is configured as an envelope detector to detect the envelope of the filtered 1/f noise, in mV and compare this voltage envelope against a reference voltage Vref applied to the non-inverting terminal of the comparator 145. In an example, comparator 145 compares the Iref current as a Vref voltage against an amplitude of the envelope of the filtered 1/f noise signal and outputs a DC voltage from node 165 as a DC output voltage (illustrated as Vout 150). In some examples, the comparator 145 outputs a high DC voltage when the amplitude envelope of the filtered noise signal 140 is lower than Vref voltage and outputs a low DC voltage when the amplitude envelope filtered noise signal 140 is higher than Vref voltage.

Figure 2:
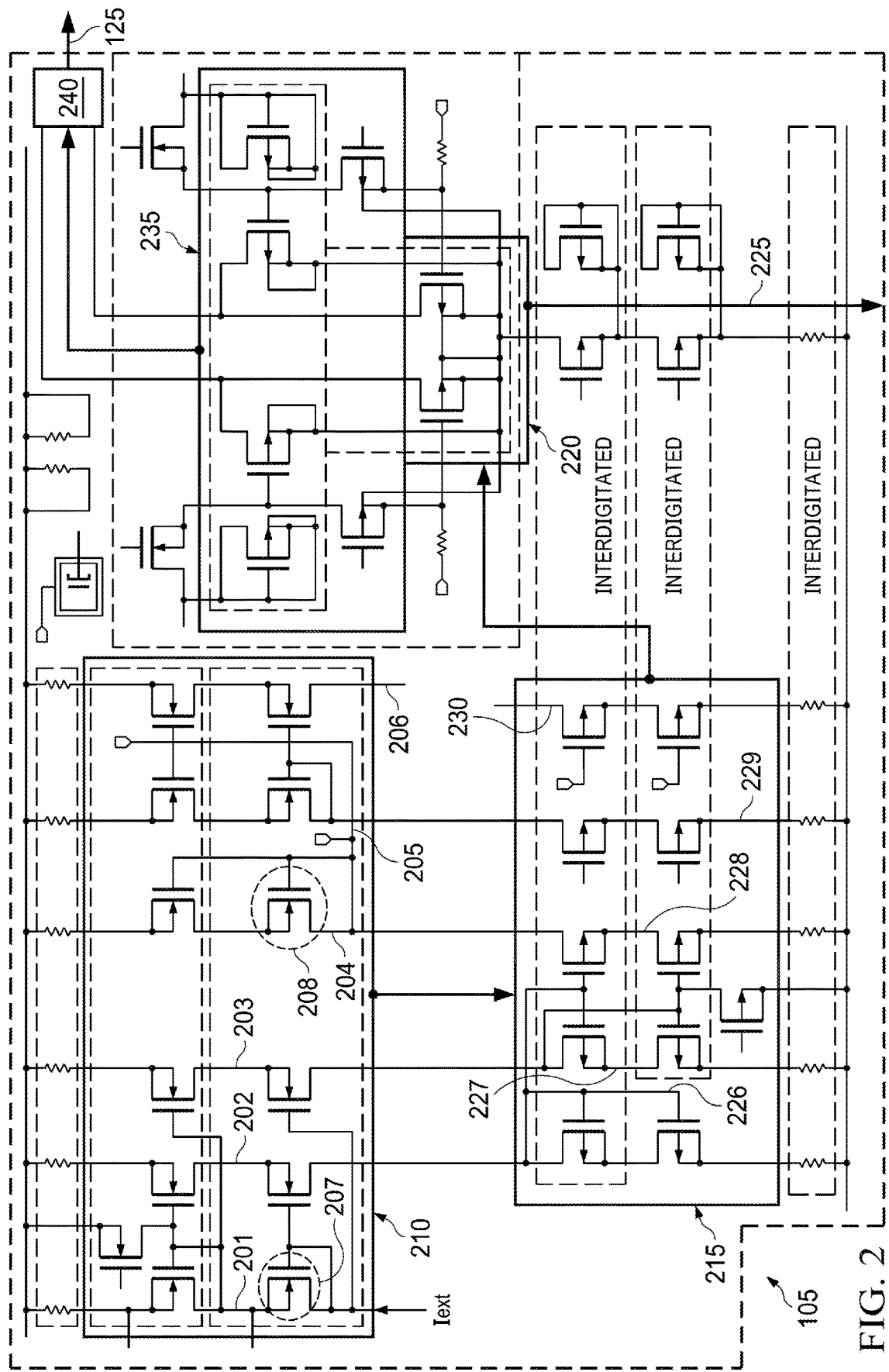
FIG. 2 is a schematic diagram of a noise generator circuit that is used in the illustrative 1/f noise measurement circuit in accordance with various examples.

Referring now to FIG. 2, a schematic diagram of the noise generator circuit 105 illustrating input NMOS and PMOS transistors that are coupled to a single NMOS transistor pair for generating 1/f noise is depicted in accordance with various embodiments. In an embodiment, 1/f noise that is generated by noise generator circuit 105 is outputted as a function of the 1/f noise signal 125 of FIG. 1. In an embodiment, noise generator circuit 105 includes a PMOS transistor block 210, a NMOS transistor block 215, and a single NMOS transistor pair 220. In one example, PMOS transistor block 205 includes PMOS transistors arranged along six legs 201-206 of the PMOS transistor block 205. Legs 201 and 204 comprises of diode-connected PMOS transistors 207, 208. Other PMOS transistors in leg 203 are current mirrors and are connected to the same Vgs of legs 201, 202 but have independent drain-to-source voltages (Vds). PMOS transistor block 210 receives Iext current (also shown in FIG. 1) from an external DC source such as, for example, an external DC tester (not shown). Iext current is a DC current and is operable to apply a Vgs voltage to the gate terminals (of the diode-connected transistors in PMOS transistors 207, 208. The diode-connected PMOS transistors 207, 208 receives the Iext current as the bias voltage to the gate and drain terminal (for example Vds) of each PMOS transistor 207, 208. The Vgs voltage to each PMOS transistor generates Ids current in each 202-203, which apply a corresponding bias condition to NMOS transistors in legs 226, 227 in NMOS transistor block 215. Iext current is configured to control an Ids of PMOS transistors 207, 208 via the bias voltage Vgs applied to the gate terminal and drain voltage Vds applied to the drain terminals. In an example, several of PMOS transistors in legs 201-206 are biased at different bias points to create specific voltage differentials that allow for a specific biasing condition.

In an embodiment, the Ids currents from the PMOS and NMOS transistor blocks 210, 215 are output to a single NMOS transistor pair 220 such that the combined Ids current in the NMOS transistor pair is 6×Iext current. NMOS transistor pair 220 is electrically coupled to NMOS transistor block 235. The NMOS transistor pair 220 and NMOS transistor block 235 are configured to be switched into or out of connection to the NMOS transistor pair 220 as a parallel connection in order to increase or decrease the size of the NMOS transistor pair 220 and generate 1/f noise that varies according to the connection. In an example, the NMOS transistor block 235 has DC quiescent currents determined by current source 225, which is generated as a current mirror from NMOS transistor block 215. further, the instantaneous or AC currents of NMOS transistor block 235 will vary as a function of 1/f noise. Also, NMOS transistor pair 220 contributes a substantial value of 1/f noise generated by noise generator circuit 105. In an example, NMOS transistor pair 220 generates over 80% of the 1/f noise amplitude generated by noise generator circuit 105. As the Ids current through the NMOS transistor pair 220 can be increased based on connecting the NMOS transistor block 235, the 1/f noise that is generated by the NMOS transistor pair 220 can also be increased.

The single transistor pairs 220 and NMOS transistor block 235 are electrically coupled to a transistor block 240. The transistor block 240 comprises PMOS and NMOS transistors that are biased in the Class AB range (i.e., the PMOS and NMOS transistors are ON for more than the one-half of a cycle, but less than the one full cycle of an input signal). The transistor block 240 amplifies outputs the 1/f noise and is outputted as a 1/f noise signal 125 based on the feedback gain of op amp 115 (FIG. 1). It is to be appreciated that using Iext current (also referred to as an active hook) to determine the bias voltages at input of PMOS transistor block 210 changes the current density of the NMOS transistors in the NMOS transistor pair 220 such that the value of the 1/f noise that is output from the noise generator circuit 105 is quantified as a function of Iext current and, hence, a function of bias voltage Vgs that is applied to the PMOS transistors in the PMOS transistor block 210. In an example, as the Iext current is increased, the 1/f noise is also increased. The power of the 1/f noise (i.e., $v^2$ of the 1/f noise signal) is proportional to the Iext current.

Figure 3A:
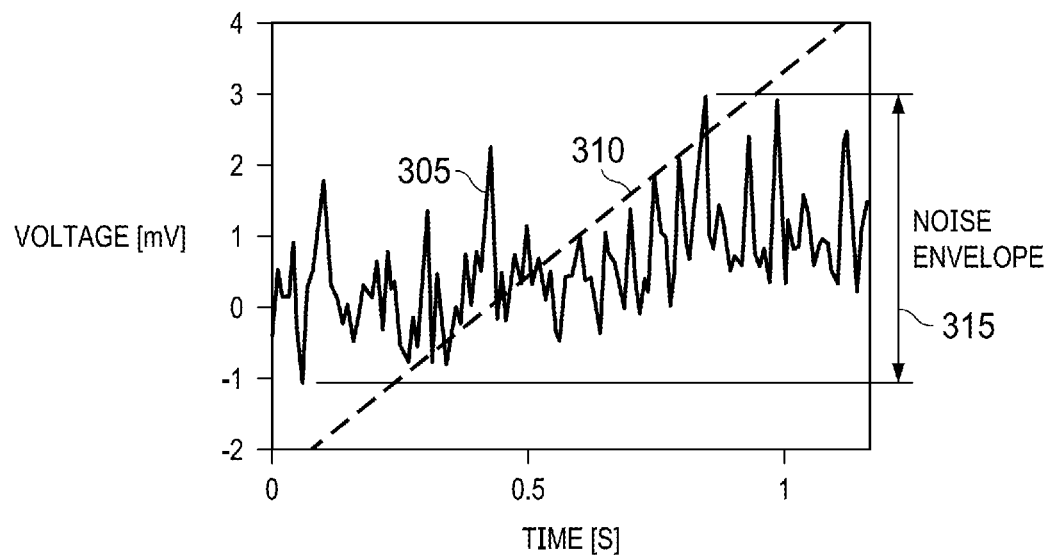
FIG. 3A is a waveform diagram of an input to a noise envelope detector circuit in accordance with various examples.
Figure 3B:
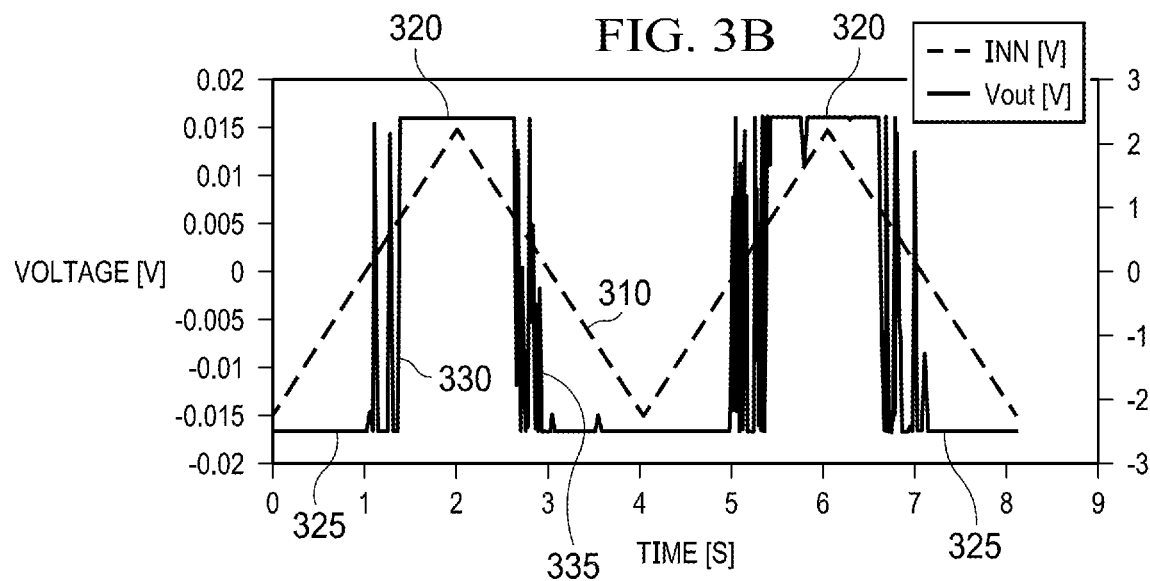
FIG. 3B is a waveform diagram of an output of a noise envelope detector circuit in accordance with various examples.

In operation, as shown in FIGS. 3A and 3B with continued reference to FIG. 1, the magnitude of the 1/f noise that is output as 1/f noise signal 305 that is generated in noise generator circuit 105 can be predicted and accurately measured using the noise envelope detector circuit 110. FIG. 3A shows an illustrative signal diagram of the 1/f noise signal 305 and reference voltage 310 (i.e., Iref×R3 in FIG. 1) of a comparator 145 (FIG. 1) in accordance with various embodiments. FIG. 3B shows an illustrative signal diagram of an output of a noise envelope detector circuit (i.e., Vout 150 of FIG. 1) in accordance with various embodiments.

As shown in FIGS. 1, 3A and 3B, the 1/f noise as 1/f noise signal 305 is generated by noise generator circuit 105 and comprises a 1/f noise envelope 315 (ΔV) that varies between, in an example, −1 mV to 3 mV. Noise envelope 315, in mV, can be determined from a current value (in Amperes) and a reference resistance R3 (in ohms shown in FIG. 1) using the formula ΔV=ΔI*R3 (Equation 1), where ΔV is a time varying voltage of the noise envelope 315 of the 1/f noise signal 305 in mV, ΔI is a time varying reference current Iref and R3 is the reference resistor. Vref at the non-inverting terminal of comparator 145 (FIG. 1) is compared with the voltage value of the 1/f noise signal 305 at the inverting terminal of comparator 145 (FIG. 3A). Based on the comparison at comparator 145 at the inverting and non-inverting terminals of the comparator 145, a high DC signal 320 or a low DC signal 325 is outputted based on the comparison.

In some examples, time varying 1/f noise signal 305 as 1/f noise envelope 315 is inputted into an inverting terminal of comparator 145 (illustrated in FIG. 1) and the noise envelope 315 is compared with the external reference voltage 310 (illustrated as Vref in FIG. 1). Reference voltage 310 is inputted into a non-inverting terminal of comparator 145 and may be changed based on the response of comparator 145 to amplitude of the 1/f noise signal 305 in 1/f noise envelope 315. For example, as shown in FIG. 3B, the voltage Vref 310 (FIG. 3A) is slowly ramped higher from a low voltage value (i.e., from a lower voltage to a higher voltage) while observing the DC output voltage 320 or 325, which indicates anytime Vref 310 crosses the noise envelope 315. The voltage Vref 310 is ramped higher until its voltage value is close to an amplitude of the value of 1/f noise signal 305 in 1/f noise envelope 315. This causes the output DC signal 330 of comparator 145 to oscillate between a low DC signal 325 (or low DC value 325) and a high DC signal 320 (or high DC value 320) until Vref 310 is higher than 1/f noise envelope 315 so that a high DC signal 320 is outputted by comparator 145 (FIG. 1). Once the Vref 310 signal does not encounter any further oscillations after a predetermined timeperiod of the comparator 145 when compared with the 1/f noise signal 305 at comparator 145 (FIG. 1) indicating that the Vref 310 is higher than the 1/f noise envelope 315, the Vref 310 signal is ramped down (i.e., from a higher voltage to a lower voltage) until Vref 310 has a voltage value (i.e. amplitude value of Vref 310) that is close to the amplitude of 1/f noise signal. At this point, the DC output signal 335 oscillates between a high DC signal 320 and a low DC signal 325 until Vref 310 ramps further down to a value lower than the amplitude of the 1/f noise envelope 315. At this point, the comparator 145 outputs a low DC signal 325 based on the comparison.

Figure 4:
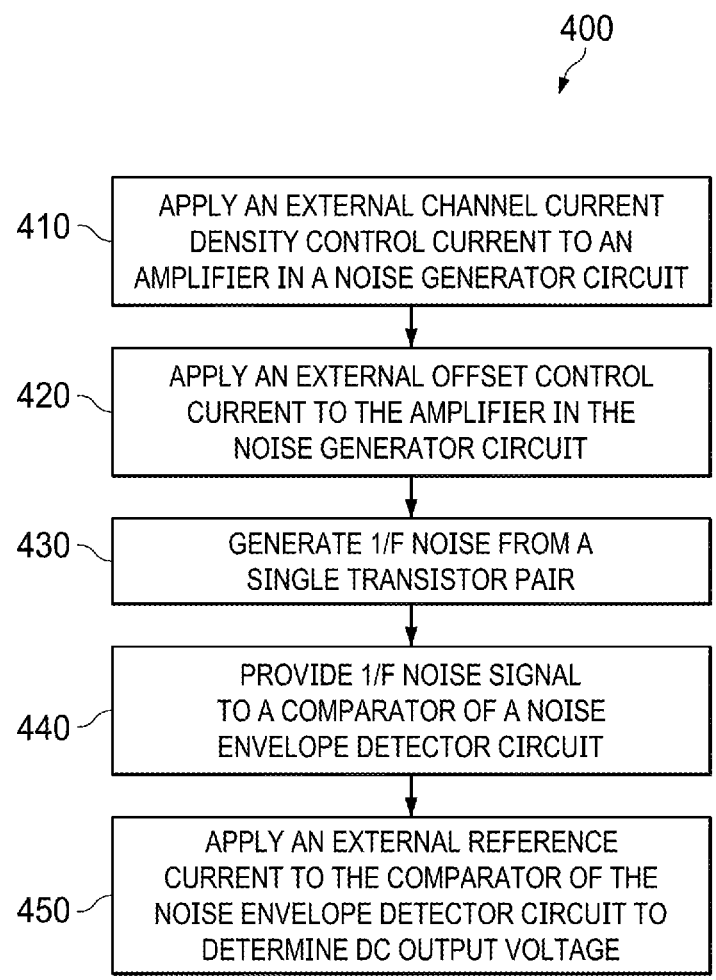
FIG. 4 is a flowchart of an illustrative method for measurement of 1/f noise in a 1/f noise measurement circuit by using direct DC measurement of an output DC voltage, in accordance with various examples.

Referring now to FIG. 4, a flowchart of an illustrative method for DC measurement of 1/f noise in a noise measurement circuit in accordance with various embodiments is shown. In an example, the method 400 is performed by noise measurement circuit, such as the 1/f noise measurement circuit 100 comprising a noise generator circuit 105 and a noise envelope detector circuit 110, discussed above with respect to FIGS. 1-3B, in order to measure a magnitude of 1/f noise in a transistor according to a bias current applied to an amplifier in the 1/f noise measurement circuit 100.

At operation 410, an external bias current is applied to an amplifier in a noise generator circuit 105. The external bias current, in an example, is a DC value of a current that is applied to an input block of PMOS transistors of an operational amplifier in order to bias the input block of PMOS transistors and generate drain-to-source currents. The PMOS transistors generate drain-to-source current that are linear factors of the external bias current. The PMOS transistors are coupled to other PMOS transistors in a current mirror configuration. Also, the drain current of the PMOS transistors apply a bias to NMOS transistors in a NMOS transistor block. Similarly, the NMOS transistors may be current-mirrored and generate Ids currents.

At operation 420, a DC offset current is applied to the amplifier in the noise generator circuit 105. The DC offset current is applied to a non-inverting terminal of an operational amplifier so as to reduce the effect of Vos from mV to nanovolts (nV) at an output of the operational amplifier when amplifying the 1/f noise signal.

At operation 430, the drain currents are input to a single NMOS single transistor pair in the noise generator circuit to generate 1/f noise. The drain currents are a linear factor of the external bias current and inputting the drain current into the single NMOS transistor pair generates 1/f noise based on a channel current density of the single transistor pair. In an embodiment, the size of the NMOS transistor pair can be changed based on switching in or out additional NMOS transistors to be in parallel to a respective NMOS transistor of the single NMOS transistor pair. The NMOS transistor pair generates greater than 80 percent (%) of the 1/f noise from the noise measurement circuit, which is outputted at the output of the noise generator circuit.

At operation 440, the 1/f noise is applied to a comparator of a noise envelope detector circuit as 1/f noise signal. In an example, the 1/f noise signal is applied to a low-pass filter at an input of the comparator to filter out the high frequency components of the noise signal and to pass signals lower than the cutoff frequency of the low-pass filter. In one example, the low-pass filter passes signals lower than 5 kHz to an inverting terminal of the comparator.

At operation 450, an external reference current signal is applied to a non-inverting terminal of the comparator of the noise envelope detector circuit. The external reference current signal is a DC signal that is used to compare with an envelope of the filtered 1/f noise signal. In an example, the external reference current signal is ramped up or down and compared to the envelope of the filtered 1/f noise signal in a comparator. The comparator compares the reference voltage signal with the envelope of the filtered 1/f noise signal and outputs a high DC voltage when the envelope of the filtered 1/f noise signal is lower than reference voltage and output a low DC voltage when the envelope of the filtered 1/f noise signal is higher than reference voltage.

In the foregoing discussion and in the claims, the terms "including" and "comprising" are used in an open-ended fashion, and thus should be interpreted to mean "including, but not limited to . . . ." Also, the term "couple", "couples" or "coupled" is intended to mean either an indirect or direct wired or wireless connection. Thus, if a first device couples to a second device, that connection may be through a direct connection or through an indirect connection via other devices and connections. Unless otherwise stated, "about", "approximately", or "substantially" preceding a value means +/−10 percent of a stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An integrated circuit, comprising:
   a noise generator circuit, comprising:
   a first amplifier including a single transistor pair, wherein the single transistor pair is operable to generate 1/f noise;
   an output amplifier coupled to the first amplifier and configured to generate a 1/f noise signal as a function of the 1/f noise; and
   a noise envelope detector circuit, comprising:
   a low pass filter operable to pass low frequency signals of the 1/f noise signal as a filtered 1/f noise signal; and
   a second amplifier or a comparator coupled to the low pass filter and operable to output a direct current (DC) voltage signal according to an envelope of the filtered 1/f noise signal, wherein the DC voltage signal is a function of an envelope of the filtered 1/f noise signal.

2. The integrated circuit of claim 1, wherein the noise generator circuit further comprises a plurality of input transistors coupled to a bias current node, wherein the bias current node is configured to receive an external bias current such that a bias voltage is applied to a gate terminal of the plurality of input transistors.

3. The integrated circuit of claim 2, wherein an amplitude of the 1/f noise is a function of the external bias current.

4. The integrated circuit of claim 1, wherein the noise generator circuit further comprises an input pad, wherein the input pad is configured to receive a DC offset current.

5. The integrated circuit of claim 4, wherein the DC offset current is operable to reduce a voltage offset value of the 1/f noise signal at an output of the noise generator circuit.

6. The integrated circuit of claim 5, wherein the first amplifier comprises an operational amplifier, wherein the operational amplifier is operable to receive the DC offset current at a non-inverting terminal of the operational amplifier.

7. The integrated circuit of claim 1, wherein the second amplifier or the comparator is operable to output the DC signal according to a comparison of the envelope of the filtered 1/f noise signal with a reference voltage signal.

8. The integrated circuit of claim 7, wherein the reference voltage signal is selectively ramped up and down within the second amplifier or the comparator according to an amplitude of the filtered 1/f noise signal.

9. The integrated circuit of claim 1, wherein the noise generator circuit further comprises an output NMOS transistor block, wherein the output NMOS transistor block is configured to be selectively coupled to the single transistor pair.

10. The integrated circuit of claim 9, wherein the output NMOS transistor block is operable to selectively increase or decrease a size of transistors in the single transistor pair.

11. An electronic device, comprising:
    a first amplifier including a single transistor pair, wherein the single transistor pair is operable to generate 1/f noise;
    a low pass filter operable to pass low frequency signals of the 1/f noise as a filtered 1/f noise; and
    a second amplifier or a comparator coupled to the low pass filter and operable to output a direct current (DC) signal according to an amplitude of the filtered 1/f noise.

12. The electronic device of claim 11, wherein the second amplifier or the comparator is operable to output the DC signal according to a comparison of the filtered 1/f noise with a reference voltage signal.

13. The electronic device of claim 12, wherein the reference voltage signal is selectively ramped up and down within the second amplifier or the comparator according to an envelope of the filtered 1/f noise.

14. The electronic device of claim 13, wherein the DC signal is a high DC value when the reference voltage signal is greater than an amplitude of the envelope.

15. The electronic device of claim 14, wherein the DC signal is a low DC value when the reference voltage signal is lesser than the amplitude of the envelope.

16. The electronic device of claim 11, wherein the first amplifier comprises:
- a single transistor pair, wherein the single transistor pair is operable to generate 1/f noise;
- an output amplifier coupled to the single transistor pair and configured to generate a 1/f noise signal as a function of the 1/f noise.

* * * * *